United States Patent
Tyson (10) Patent No.: US 7,038,488 B1
(45) Date of Patent: May 2, 2006

(54) PROGRAMMABLE LOGIC DEVICE WITH TRANSCEIVER AND RECONFIGURABLE PLL

(75) Inventor: James Tyson, Buckinghamshire (GB)

(73) Assignee: Altera Corporation, Fremont, CA (US)

( * ) Notice: Subject to any disclaimer, the term of this patent is extended or adjusted under 35 U.S.C. 154(b) by 71 days.

(21) Appl. No.: 10/836,965

(22) Filed: Apr. 30, 2004

(51) Int. Cl.
*H03K 19/173* (2006.01)
*G06F 7/38* (2006.01)

(52) U.S. Cl. .......................... 326/37; 326/39

(58) Field of Classification Search .......... 326/37, 326/38, 39, 40, 41, 46
See application file for complete search history.

(56) References Cited

U.S. PATENT DOCUMENTS

| | | | |
|---|---|---|---|
| 6,624,766 B1* | 9/2003 | Possley et al. | 341/69 |
| 6,750,675 B1* | 6/2004 | Venkata et al. | 326/41 |
| 2003/0042941 A1* | 3/2003 | Wang et al. | 327/108 |

OTHER PUBLICATIONS

"Implementing PLL Reconfiguration in Stratix & Stratix GX Devices," product application notes, 282 version 1.0, from Altera Corporation San Jose, CA (Jan. 2003), pp. 1-30.

"Selecting the Correct High Speed Transceiver Solution," product White Paper version 1.0, from Altera Corporation San Jose, CA (Sep. 2003), pp. 1-11.

"The Evolution of High speed Transceiver Technology," product White Paper version 1.0, from Altera Corporation San Jose, CA (Nov. 2002), pp. 1-15.

"Stratix Device Family Data Sheet," product data sheet version 2.2, pp. 2-71 through 2-144, from Altera Corporation San Jose, CA (Jan. 2004).

* cited by examiner

*Primary Examiner*—Daniel D. Chang
(74) *Attorney, Agent, or Firm*—Townsend and Townsend and Crew, LLP (57) ABSTRACT

A programmable logic device (PLD) includes a transceiver, configurable phase-locked loop (PLL) circuits, and programmable logic circuits. The logic circuits and PLL circuits are programmed to enable the transceiver to flexibly respond to various types of input serial data signals, and to flexibly generate various types of output serial data signals, such as Serial Digital Interface (SDI) signals and High Definition SDI (HD-SDI) signals. This allows the PLD to be used in a wide variety of systems without requiring custom external components.

21 Claims, 5 Drawing Sheets

PROGRAMMABLE LOGIC DEVICE WITH TRANSCEIVER AND RECONFIGURABLE PLL

BACKGROUND OF THE INVENTION

The present invention relates to programmable logic devices (PLDs). More particularly, the present invention relates to a PLD with a transceiver and a reconfigurable phase-locked loop (PLL) circuit.

A PLD is a flexible device that includes programmable function blocks (also called IP blocks in the industry) programmably connected via a programmable interconnect structure. Typical function blocks include logic blocks, processor blocks, signal processor blocks, PLL blocks, memory blocks, input/output blocks, etc. A user can select which blocks to connect, and the functionality of each block, depending on the particular job the PLD is to perform. In this manner, a PLD is a low-cost and flexible solution to a wide variety of system requirements.

Exemplary PLDs include field programmable gate arrays (FPGAs) such as STRATIX™ devices, APEX™ devices, and FLEX® devices; complex programmable-logic devices (CPLDs) such as MAX® devices; and embedded processors such as EXCALIBUR™ devices, all from Altera Corp., San Jose, Calif.

A PLL circuit is a circuit that generates an output signal based on an input signal. A typical PLL circuit includes a reference divider, a feedback divider, a comparator, a charge pump, a loop filter, and an oscillator. The output signal is then a function of the input signal and a ratio between the reference divider and the feedback divider. In a reconfigurable PLL, the values in the dividers are programmable, which allows the PLL to generate a very wide variety of output signal frequencies that can be changed during normal system operation.

One type of function performed by some PLDs is a transceiver function. A transceiver refers to a circuit element that receives and input signal and/or generates an output signal. For the wide variety of potential systems that use PLDs, a correspondingly wide variety of input signal types are provided as inputs to the transceiver. In many instances, numerous external components must be provisioned so that the input signal to the PLD conforms to a particular type of signal. Similarly, a correspondingly wide variety of output signal types may need to be provided as inputs to other system components from the output signals from the PLD, which in many existing systems may also require numerous components between the PLD and the other system components.

There is a need for a PLD that more flexibly responds to the wide variety of potential input signals, and that more flexibly generates a wide variety of potential output signals, without requiring dependence upon external components.

BRIEF SUMMARY OF THE INVENTION

Embodiments of the present invention are directed toward using elements of the PLD to allow the transceiver to be used with a wider variety of input signals, and to generate a wider variety of output signals, without requiring the use of external components.

According to one embodiment, an apparatus includes a PLD. The PLD includes a first PLL circuit and a transceiver control block. The first PLL circuit generates a first PLL output signal. The first PLL output signal is one of a first plurality of configurable output signals. The transceiver control block is coupled to the first PLL circuit. The transceiver control block receives an input serial data signal and the first PLL output signal, samples the input serial data signal using the first PLL output signal, and generates a parallel data signal from the input serial data signal having been sampled.

According to another embodiment, an apparatus includes a PLD. The PLD includes a control circuit, a PLL circuit, and a transceiver circuit. The control circuit receives a first reference signal and an input serial data signal, and selectively generates a second reference signal based on a selected one of the input serial data signal and the first reference signal. The PLL circuit is coupled to the control circuit. The PLL circuit receives the second reference signal and generates a PLL output signal based on the second reference signal. The transceiver circuit is coupled to the PLL circuit. The transceiver circuit receives the input serial data signal and the PLL output signal, samples the input serial data signal using the PLL output signal, and generates a parallel data signal from the input serial data signal having been sampled. The control circuit trains the PLL circuit by selecting the first reference signal, then selects the input serial data signal once the PLL circuit has been trained.

The PLDs discussed above may further include a second PLL circuit and a second transceiver control block. The second PLL circuit generates a second PLL output signal. The second transceiver control block receives a second parallel data signal and the second PLL output signal, samples the second parallel data signal using the second PLL output signal, and generates an output serial data signal from the second parallel data signal having been sampled.

The PLDs discussed above may also include a plurality of programmable function blocks and an interconnect. The function blocks perform a variety of programmable functions and include the first PLL circuit and the transceiver control block. The interconnect programmably interconnects the plurality of programmable function blocks.

According to another embodiment, a method operates a PLD. The method includes generating a first PLL output signal. The first PLL output signal is one of a first plurality of configurable output signals. The method further includes receiving the first PLL output signal and an input serial data signal, and selectively generating a reference signal based on a selected one of the input serial data signal and the first PLL output signal. The first PLL output signal is selected to train a PLL circuit of the PLD, and the input serial data signal is selected once the PLL circuit has been trained. The method further includes receiving the reference signal and generating a second PLL output signal based on the reference signal. The method further includes receiving the input serial data signal and the second PLL output signal, sampling the input serial data signal using the second PLL output signal, and generating a parallel data signal from the input serial data signal having been sampled.

A more refined understanding of the embodiments of the present invention may be gained with reference to the following drawings and accompanying detailed description.

DETAILED DESCRIPTION OF THE INVENTION

Figure 1:
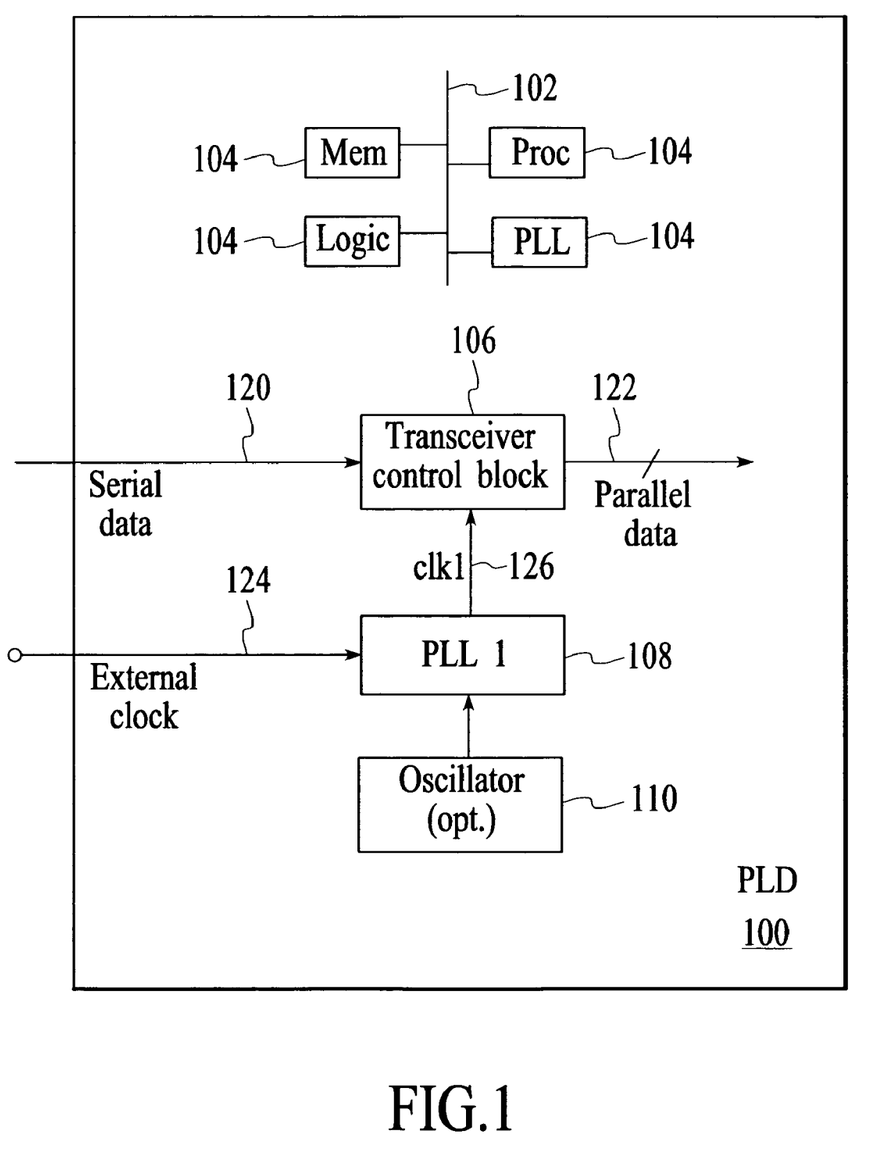
FIG. 1 is a block diagram of a transceiver in a PLD according to an embodiment of the present invention.

FIG. 1 is a block diagram of a PLD 100 according to an embodiment of the present invention. The PLD 100 includes an interconnect 102 and various function blocks 104. Specific elements of note in the function blocks 104 include a transceiver control block 106, a PLL circuit 108, and an optional oscillator 110. Signals of note include an input serial data signal 120, a parallel data signal 122, and an external clock signal 124, and a PLL output signal (clk1) 126. In general, the function of note is the conversion of the input serial data signal 120 into the parallel data signal 122.

The PLL 108 may be configured to output a wide variety of output signal frequencies based upon the configuration of its reference divider and feedback divider. The PLL 108 according to one embodiment uses an external clock 124 as its input. The external clock 124 may be provided to a pin on the package of the PLD 100. According to another embodiment, an oscillator 110 generates the input signal to the PLL 108. The oscillator 110 may be a crystal oscillator.

The transceiver control block 106 receives the PLL output signal 126 and the input serial data signal 120, and generates the parallel data signal 122. In effect, the transceiver control block 106 uses the PLL output signal 126 to sample the input serial data signal 120.

The transceiver control block 106 may selectively operate in one of two modes, or a combination thereof. The two modes are "locktorefclk" mode and "locktodata" mode.

In "locktodata" mode, the transceiver control block 106 locks to the input serial data signal 120 for performing the conversion to the parallel data signal 122. "Locktodata" mode is further described with reference to FIG. 2 below.

In "locktorefclk" mode, the transceiver control block 106 performs a fixed-frequency serial-to-parallel conversion of the input serial data 120. The rate at which the input serial data 120 is sampled is a fixed multiple of the frequency of a reference clock. For example, when the transceiver control block 106 is configured to provide a 10-bit parallel word, and the reference clock may be 135 MHz, the serial data may be sampled at 1350 Mbps (regardless of the actual data rate of the input serial data signal 120).

As one example of "locktorefclk" mode, assuming an external clock input of 27 MHz, the PLL 108 may be configured to provide a multiple of 5 as the output frequency, resulting in the PLL output signal 126 having a frequency of 135 MHz. The PLL 108 may be reconfigured to provide a multiple of 24/5 as the output frequency, resulting in the PLL output signal 126 having a frequency of 129.6 MHz.

The transceiver control block 106 is then driven by the PLL output signal 126. By using the reconfigurability of the PLL 108, the sample rate of the transceiver control block 106 can be dynamically changed.

Serial Digital Interface (SDI) is a serial interface that typically runs at 270 Mbps. There are variants of SDI that run at other frequencies, such as 259.2 Mbps. (Note that 259.2 Mbps is the ratio 24/25 times 270 Mbps.)

The transceiver control block 106 may oversample the input serial data signal 120. Logic circuitry in the transceiver control block 106 then extracts the original 270 Mbps data. For example, if a 5× oversample is used, the sampling rate is 1350 Mbps for 270 Mbps data. In such a case, the PLL 108 provides the PLL output signal 126 having a frequency of 135 MHz to the transceiver control block 106.

Continuing the example, to also support 259.2 Mbps SDI, the PLL 108 may be reconfigured to change the PLL output signal 126 to have a frequency of 129.6 MHz.

In both cases, the same input clock signal of 27 MHz may be provided to the PLL 108 (for example, via the external clock signal 124).

Figure 2:
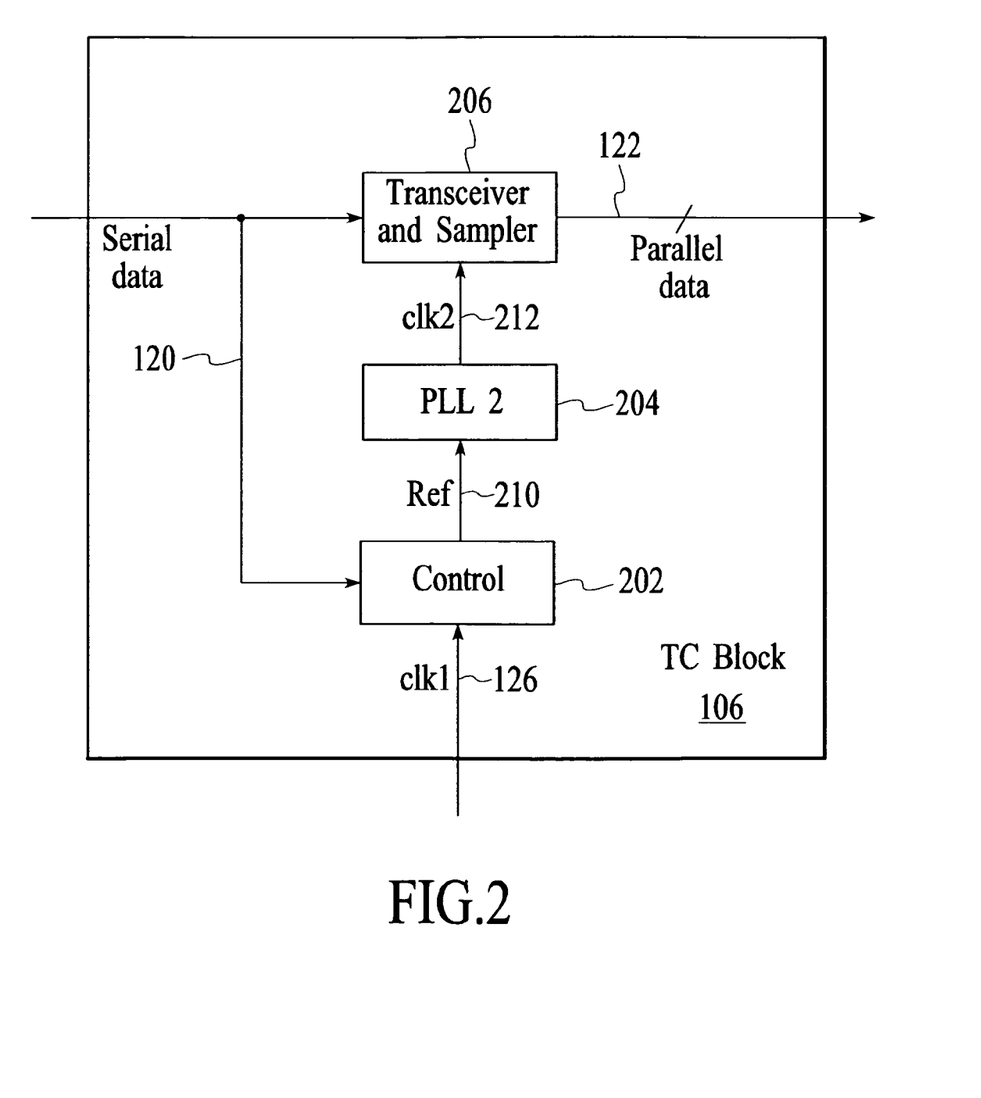
FIG. 2 is a block diagram of a transceiver in a PLD according to another embodiment of the present invention.

FIG. 2 is a block diagram of one embodiment of the transceiver control block 106. The transceiver control block 106 includes a control circuit 202, a PLL circuit 204, and a transceiver and sampler 206. Signals of note include a reference signal 210 and a PLL output signal (clk2) 212. As with FIG. 1, these components may be implemented using the function blocks of the PLD 100.

The control circuit 202 receives the PLL output signal 126 (see FIG. 1) and the input serial data signal 120, and generates the reference signal 210. Initially, the control circuit 202 uses the PLL output signal 126 to generate the reference signal 210. (This is also referred to as "locktorefclk" mode.) At a later point, the control circuit switches over to the input serial data signal 120 and uses the input serial data signal 120 to generate the reference signal 210. (This is also referred to as "locktodata" mode.) The control circuit may include frequency multipliers and dividers that are used to adjust the particular signal used as the input to generate the output reference signal 210.

The PLL 204 receives the reference signal 210 and generates the PLL output signal 212. Thus, depending upon whether the reference signal 210 corresponds to the input serial data signal 120 or the PLL output signal 126, the PLL 204 controls the phase-locked loop in either "locktodata" mode or "locktorefclk" mode, respectively.

The transceiver and sampler 206 receives the input serial data signal 120 and the PLL output signal 212, and generates the parallel data signal 122. In effect, the transceiver and sampler 206 uses the PLL output signal 212 to sample the input serial data signal 120. The transceiver and sampler 206 may oversample the input serial data signal. The transceiver and sampler 206 may include frequency multipliers and dividers that are used to adjust the PLL output signal 212 to achieve a desired sampling or oversampling frequency.

Initially, the control block 202 directs the transceiver and sampler 206 to use the PLL output signal 126 to track the data rate of the input serial data signal 120. The PLL 204 is trained with the PLL output signal 126 so that it is approximately centered on the frequency of the input serial data signal 120.

As an example, when the transceiver and sampler 206 is configured to provide a 20-bit parallel word, and the PLL output signal 126 is 74.25 MHz, the PLL 204 may be trained to sample the input serial data signal 120 at 1485 Mbps (regardless of the actual data rate of the input serial data signal 120). Once the PLL 204 has been trained, the control block 202 allows the PLL 204 to track the actual data rate of the input serial data signal 120, which is typically within a small part per million (ppm) of the trained frequency.

The control block 202 may use various criteria in deciding when to switch from "locktorefclk" mode to "locktodata" mode. As one option, the control block 202 may be programmed with an adjustable time period that has been calculated as a reasonable training period. As another option, the control block 202 may monitor the PLL 204 and may switch to "locktodata" modes once the PLL output signal 212 is within a defined tolerance, such as a frequency tolerance. As another option, the control block 202 may monitor the input serial data signal 120 and may begin training when a signal is detected. As another option, the control block 202 may monitor the PLL 204 and/or the input serial data signal 120 and may switch back to "locktorefclk" mode if instability or other undesirable signal properties arise in the PLL output signal 212, in the input serial data signal 120, and/or in other signals internal to the PLL 204.

As described above with reference to FIG. 1, the PLL 108 may be reconfigured to change the frequency of the PLL output signal 126, thereby changing the training frequency used on the PLL 204. Thus, the training frequency of the PLL 204 may be dynamically changed.

For example, the PLL 108 may initially be configured to provide a frequency multiplier of 11/4. With a 27 MHz input clock, this results in the PLL output signal 126 having a frequency of 74.25 MHz. The PLL 108 may be reconfigured to provide a frequency multiplier of 250/91. This then results in the PLL output signal 126 having a frequency of 74.175 MHz.

High Definition Serial Digital Interface (HD-SDI) is a serial interface that typically runs at 1485 Mbps or 1435 Mbps. The transceiver control block 106 supports 1485 Mbps HD-SDI by using a 74.25 MHz reference signal (PLL output signal 126), and 1435 Mbps HD-SDI by using a 74.175 Mbps reference signal (PLL output signal 126). To support both these HD-SDI rates, the PLL 108 may be dynamically reconfigured.

Figure 3:
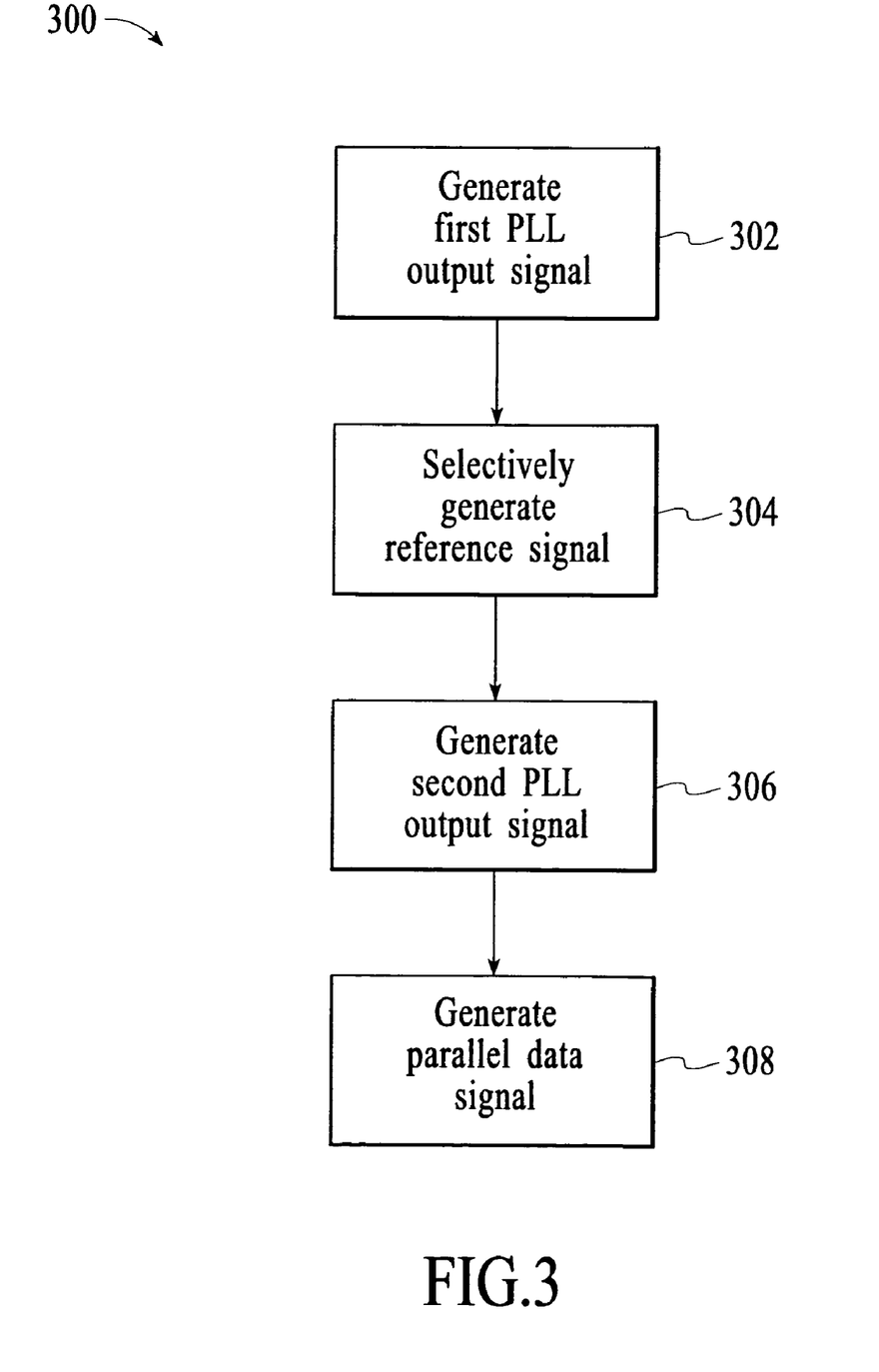
FIG. 3 is a flowchart of a method of operating a transceiver in a PLD according to an embodiment of the present invention.

FIG. 3 is a flowchart of a method 300 of operating a transceiver and related circuitry in the PLD 100 according to an embodiment of the present invention. In step 302, the PLL 108 generates the PLL output signal 126.

In step 304, the control block 202 receives the PLL output signal 126 and the input serial data signal 120. The control block 202 selectively generates the reference signal 210 based on a selected one of the input serial data signal 120 and the PLL output signal 126. The control block 202 initially selects the PLL output signal 126 to train the PLL 204. The control block 202 later selects the input serial data signal 120 once the PLL 204 has been trained.

In step 306, the PLL 204 receives the reference signal 210. Based on this signal, the PLL 204 generates the PLL output signal 212.

In step 308, the transceiver and sampler 206 receives the input serial data signal 120 and the PLL output signal 212. The transceiver and sampler 206 samples the input serial data signal 120 using the PLL output signal 212. The transceiver and sampler 206 generates the parallel data signal from the input serial data signal 120 having been sampled.

Figure 4:
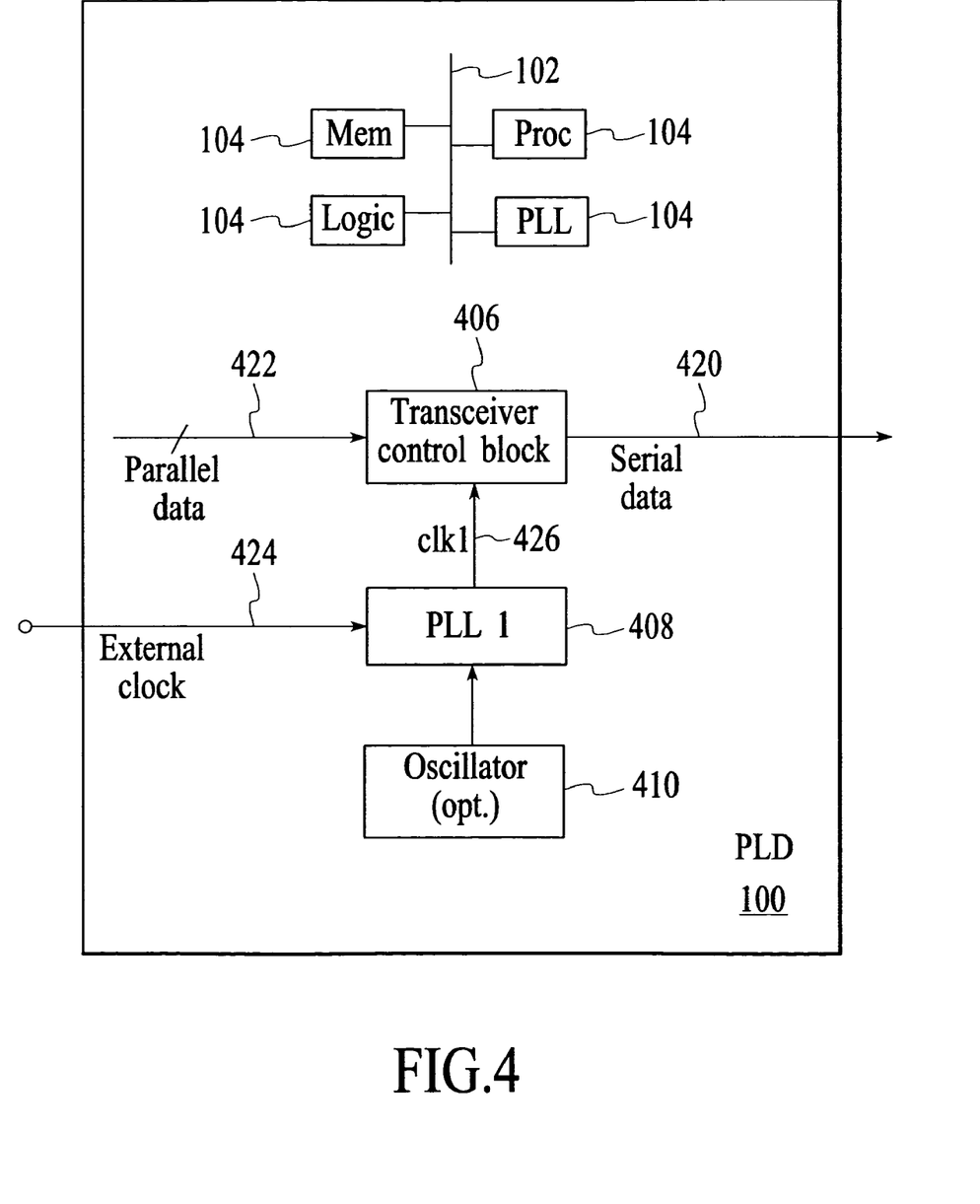
FIG. 4 is a block diagram of a transceiver in a PLD according to another embodiment of the present invention.

FIG. 4 is a block diagram showing further features of the PLD 100. FIG. 4 is similar to FIG. 1, except in FIG. 4 the transceiver generates an output of the PLD 100 (that is, the transceiver is configured as a transmitter). These features shown in FIG. 4 may be implemented along with the features shown in FIG. 1, or may be implemented separately.

In most cases, the elements of FIG. 4 are similar to the elements of FIG. 1. The interconnect 102 and function blocks 104 perform essentially the same function. The transceiver control block 406 receives a parallel data signal 420 as an input and generates a serial data signal 422 as an output. The transceiver control block 406 is clocked by the clk1 signal 426.

The PLL1 408 receives an input signal (either an external clock signal 424 or a signal from an optional oscillator 410) and generates the clk1 signal 426. The PLL1 408 otherwise may be similar to the PLL 108 of FIG. 1. The external clock signal 424 may correspond to the external clock signal 124 (see FIG. 1), for example by being connected to the same pin. The oscillator 410 may be the same as the oscillator 110; for example, a single oscillator may provide the same reference signal to the PLL1 108 and the PLL1 408.

The parallel data signal 420 may correspond to the parallel data signal 122 (see FIG. 1), or it may correspond to a different parallel data signal. For example, in some configurations, the PLD 100 may be configured to receive an SDI signal, process the SDI signal, convert the processed SDI signal to an HD-SDI signal, and then output the converted HD-SDI signal.

Given the similarity of the components between FIGS. 1 and 4, it can be seen that a given transceiver may be easily configured as a receiver (see FIG. 1) or as a transmitter (see FIG. 4) according to the particular desired use of the PLD 100.

Figure 5:
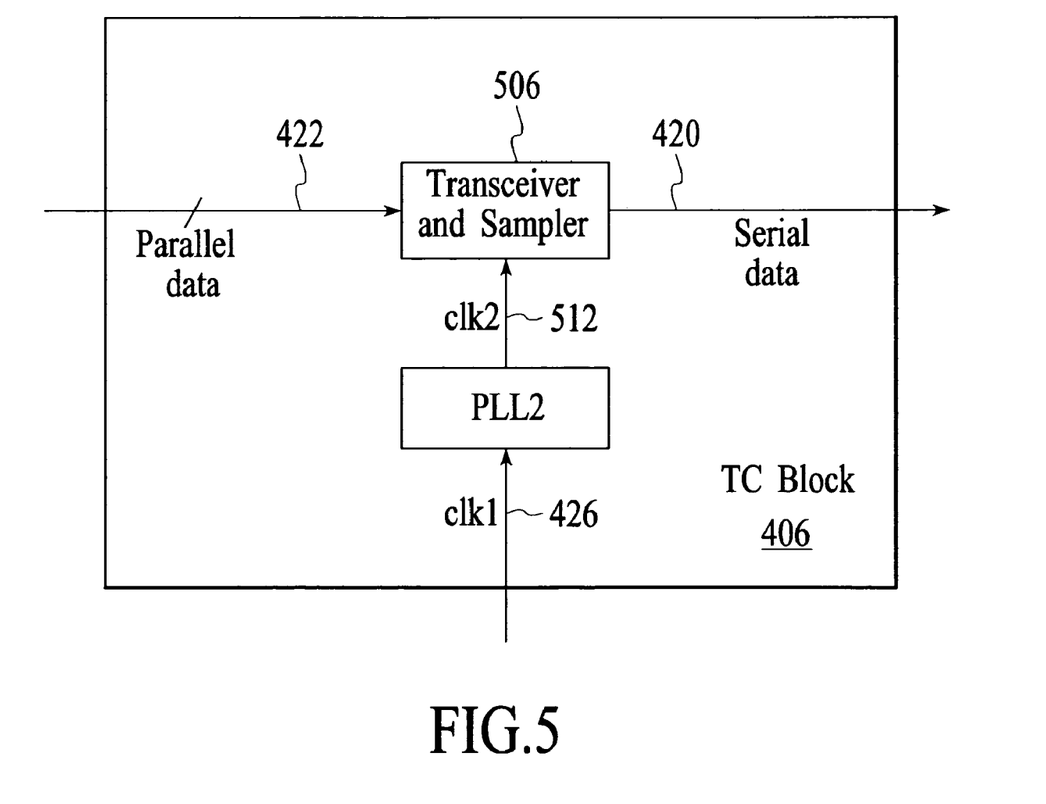
FIG. 5 is a block diagram of a transceiver in a PLD according to another embodiment of the present invention.

FIG. 5 is a block diagram of one embodiment of the transceiver control block 406. The transceiver control block 406 is similar to the transceiver control block 106 (see FIG. 2) and includes a PLL2 504 and a transceiver and sampler 506. The control block 202 (see FIG. 2) is unnecessary to the function of FIG. 5. In particular, in the embodiment shown in FIG. 5, the "locktorefclk" mode is used, and the "locktodata" mode is not used. In other embodiments, the "locktodata" mode may be used, in which case the structure and functionality is more similar to that of FIG. 2.

The transceiver and sampler 506 receives the parallel data signal 420 and generates the serial data signal 422. The transceiver and sampler 506 is otherwise similar to the transceiver and sampler 206 (see FIG. 2). The transceiver and sampler 506 is clocked by the clk2 signal 512 from the PLL2 504. The PLL2 504 generates the clk2 signal 512 based on the clk1 signal 426 in a manner similar to that described above with reference to the PLL2 204 (see FIG. 2).

Given the similarity of the components between FIGS. 2 and 5, it can be seen that a given transceiver and sampler may be easily configured as a receiver (see FIG. 2) or as a transmitter (see FIG. 5) according to the particular desired use of the PLD 100. In such a case, an unnecessary component may be present in the transceiver control block 406 (such as the control block 202), but may be disabled or bypassed according to the particular configuration.

Although the above description has focused on the use of phase-locked loops, it is recognized that similar functionality may be gained from the use of other types of feedback circuits, such as delay-locked loop (DLL) circuits. The choice of loop circuit may be made depending upon other design constraints and considerations.

Although the above description has focused on serial-to-parallel and parallel-to-serial conversions generally, and SD/HD-SDI specifically, it is recognized that similar principles may be applied to other types of signal conversions.

Although the above description has focused on specific embodiments, various modifications and their equivalents are to be considered within the scope of the present invention, which is defined by the following claims.

What is claimed is:

1. An apparatus including a programmable logic device (PLD), said PLD comprising:
   a first feedback loop circuit that generates a first feedback loop output signal, wherein said first feedback loop output signal is one of a first plurality of configurable output signals; and
   a transceiver control block, coupled to said first feedback loop circuit, that receives an input serial data signal and said first feedback loop output signal, that samples said input serial data signal using said first feedback loop output signal, and that generates a parallel data signal from said input serial data signal having been sampled, wherein the transceiver control block is capable of selectively operating with said input serial data or said first feedback loop output signal to sample said input serial data signal.

2. The apparatus of claim 1, wherein said transceiver control block comprises:
   a control circuit that receives said first feedback loop output signal and said input serial data signal, and that selectively generates a reference signal based on a selected one of said input serial data signal and said first feedback loop output signal;
   a second feedback loop circuit, coupled to said control circuit, that receives said reference signal and that generates a second feedback loop output signal based on said reference signal; and
   a transceiver circuit, coupled to said second feedback loop circuit, that receives said input serial data signal and said second feedback loop output signal, that samples said input serial data signal using said second feedback loop output signal, and that generates said parallel data signal from said input serial data signal having been sampled,
   wherein said control circuit trains said second feedback loop circuit by selecting said first feedback loop output signal, then selects said input serial data signal once said second feedback loop circuit has been trained.

3. The apparatus of claim 1, wherein said input serial data signal corresponds to a High Definition Serial Digital Interface (HD-SDI) signal.

4. The apparatus of claim 1, wherein said first feedback loop circuit receives an external reference signal and generates said first feedback loop output signal based on said external reference signal.

5. The apparatus of claim 4, wherein said PLD further comprises a pin that receives said external reference signal.

6. The apparatus of claim 1, wherein said PLD further comprises a crystal oscillator, coupled to said first feedback loop circuit, that generates an internal reference signal, wherein said first feedback loop circuit receives said internal reference signal and generates said first feedback loop output signal based on said internal reference signal.

7. The apparatus of claim 1, wherein said input serial data signal corresponds to a Serial Digital Interface (SDI) signal.

8. The apparatus of claim 7, wherein said first plurality of configurable output signals includes a first signal having a frequency of 135 MHz and a second signal having a frequency of 129.6 MHz.

9. The apparatus of claim 1, wherein said transceiver control block oversamples said input data signal at an oversampling rate of 5.

10. The apparatus of claim 1, wherein said PLD further comprises:
    a plurality of programmable function blocks that perform a variety of programmable functions, wherein said plurality of function blocks includes said first feedback loop circuit and said transceiver control block; and
    an interconnect that programmably interconnects said plurality of programmable function blocks.

11. The apparatus of claim 1, wherein said PLD controls said first feedback loop circuit and said transceiver control block to programmably select a rate of said parallel data signal without the use of components external to the PLD.

12. The apparatus of claim 1, wherein said PLD further comprises:
    a second feedback loop circuit that generates a second feedback loop output signal, wherein said second feedback loop output signal is one of a second plurality of configurable output signals; and
    a second transceiver control block, coupled to said second feedback loop circuit, that receives a second parallel data signal and said second feedback loop output signal, that samples said second parallel data signal using said second feedback loop output signal, and that generates an output serial data signal from said second parallel data signal having been sampled.

13. The apparatus of claim 12, wherein said second transceiver control block comprises:
    a third feedback loop circuit that receives said second feedback loop output signal and that generates a third feedback loop output signal based on said second feedback loop output signal; and
    a transceiver circuit, coupled to said third feedback loop circuit, that receives said second parallel data signal and said third feedback loop output signal, that samples said second parallel data signal using said third feedback loop output signal, and that generates said output serial data signal from said second parallel data signal having been sampled.

14. The apparatus of claim 12, wherein said output serial data signal corresponds to one of a Serial Digital Interface (SDI) signal and a High Definition SDI (HD-SDI) signal.

15. The apparatus of claim 12, wherein said PLD further comprises:
    a plurality of programmable function blocks that perform a variety of programmable functions, wherein said plurality of function blocks includes said second feedback loop circuit and said second transceiver control block; and
    an interconnect that programmably interconnects said plurality of programmable function blocks.

16. The apparatus of claim 12, wherein said PLD controls said second feedback loop circuit and said second transceiver control block to programmably select a rate of said output serial data signal without the use of components external to the PLD.

17. An apparatus including a programmable logic device (PLD), said PLD comprising:
    a control circuit that receives a first reference signal and an input serial data signal, and that selectively generates a second reference signal based on a selected one of said input serial data signal and said first reference signal;
    a feedback loop circuit, coupled to said control circuit, that receives said second reference signal and that generates a feedback loop output signal based on said second reference signal; and
    a transceiver circuit, coupled to said feedback loop circuit, that receives said input serial data signal and said feedback loop output signal, that samples said input serial data signal using said feedback loop output signal, and that generates a parallel data signal from said input serial data signal having been sampled,
    wherein said control circuit trains said feedback loop circuit by selecting said first reference signal, then selects said input serial data signal once said feedback loop circuit has been trained.

18. The apparatus of claim 17, wherein said PLD controls said feedback loop circuit and said transceiver circuit block to programmably select a rate of said parallel data signal without the use of components external to the PLD.

19. The apparatus of claim 17, wherein said PLD further comprises:
- a plurality of programmable function blocks that perform a variety of programmable functions, wherein said plurality of function blocks includes said control circuit, said feedback loop circuit and said transceiver circuit; and
- an interconnect that programmably interconnects said plurality of programmable function blocks.

20. A method of operating a programmable logic device (PLD), comprising the steps of:
- generating a first feedback loop output signal, wherein said first feedback loop output signal is one of a first plurality of configurable output signals;
- receiving said first feedback loop output signal and an input serial data signal, and selectively generating a reference signal based on a selected one of said input serial data signal and said first feedback loop output signal, wherein said first feedback loop output signal is selected to train a feedback loop circuit of said PLD, and wherein said input serial data signal is selected once said feedback loop circuit has been trained;
- receiving said reference signal and generating a second feedback loop output signal based on said reference signal; and
- receiving said input serial data signal and said second feedback loop output signal, sampling said input serial data signal using said second feedback loop output signal, and generating a parallel data signal from said input serial data signal having been sampled.

21. The method of claim 20, further comprising:
- generating a third feedback loop output signal, wherein said third feedback loop output signal is one of a second plurality of configurable output signals; and
- receiving a second parallel data signal and said third feedback loop output signal, sampling said second parallel data signal using said third feedback loop output signal, and generating an output serial data signal from said second parallel data signal having been sampled.

* * * * *

UNITED STATES PATENT AND TRADEMARK OFFICE
CERTIFICATE OF CORRECTION

PATENT NO. : 7,038,488 B1 Page 1 of 1
APPLICATION NO. : 10/836965
DATED : May 2, 2006
INVENTOR(S) : James Tyson

It is certified that error appears in the above-identified patent and that said Letters Patent is hereby corrected as shown below:

On Title Page
Please correct the address of Assignee, item (73), as indicated below:

Altera Corporation, San Jose, CA (US)

Signed and Sealed this

Twenty-seventh Day of November, 2007

JON W. DUDAS
*Director of the United States Patent and Trademark Office*